United States Patent [19]

Kurtz et al.

[11] 4,202,217
[45] May 13, 1980

[54] SEMICONDUCTOR TRANSDUCERS EMPLOYING FLAT BONDABLE SURFACES WITH BURIED CONTACT AREAS

[75] Inventors: Anthony D. Kurtz, Englewood; Joseph R. Mallon, Franklin Lakes, both of N.J.

[73] Assignee: Kulite Semiconductor Products, Inc., Ridgefield, N.J.

[21] Appl. No.: 859,834

[22] Filed: Dec. 12, 1977

[51] Int. Cl.² ............................................. G01L 9/06
[52] U.S. Cl. ...................................... 73/727; 73/777; 338/4
[58] Field of Search ................. 73/88.55 D, 721, 727, 73/777; 338/2, 4, 42; 357/26

[56] References Cited

U.S. PATENT DOCUMENTS

| | | | |
|---|---|---|---|
| 3,739,315 | 6/1973 | Kurtz et al. | 73/88.55 D X |
| 3,753,196 | 8/1973 | Kurtz et al. | 73/88.55 D X |
| 3,858,150 | 12/1974 | Gurtler et al. | 73/88.55 D X |
| 4,003,127 | 1/1977 | Jaffee et al. | 357/26 X |

Primary Examiner—Charles A. Ruehl
Attorney, Agent, or Firm—Arthur L. Plevy

[57] ABSTRACT

A semiconductor pressure transducer includes a base member fabricated from n-type silicon. The base member has a central depression defining an active area and located on a bottom surface; diffused in the top surface, is at least one contact area which is directed from the active region towards the periphery of said base member. A piezoresistive sensor is located on said top surface and in contact with said contact area within said active region. A layer of epitaxial material surrounds the active region and has an aperture on the surface which is in communication with the contact area outside said active region. The epitaxial layer is polished at a top surface and a housing is coupled to the region by means of a suitable bond. Alternate methods of fabricating the transducer are shown employing both polycrystalline and monocrystalline epitaxial layers.

13 Claims, 15 Drawing Figures

SEMICONDUCTOR TRANSDUCERS EMPLOYING FLAT BONDABLE SURFACES WITH BURIED CONTACT AREAS

BACKGROUND OF INVENTION

This invention relates to strain transducers of the type employing piezoresistive sensing devices formed in a semiconductor wafer.

As is known, there exists a wide variety of semiconductor pressure transducers employed for sensing pressure or force. As such, the transducers are employed in a wide range of applications and are used in the aerospace, automotive, and medical fields.

Many such transducers employ piezoresistive devices which in general, exhibit a change in resistance which is proportional to the magnitude of an applied force. These transducers are fabricated by employing conventional semiconductor techniques and hence, are amenable to mass production in regard to semiconductor technology. As such, the piezoresistive sensor may be bonded or diffused into a diaphragm which is fabricated from a semiconductor material such as silicon.

A sensing element in conjunction with the diaphragm is usually coupled or secured to a housing; which housing serves as a support for the diaphragm and furthermore, enables the routing of leads associated with the sensing elements to enable monitoring of a pressure or a force in an environment. In many such applications, the coupling of the device or diaphragm assembly to the housing can constitute a significant problem. This is due to the fact that based on the multitude of various environments in which the transducer must operate, the bonding of the diaphragm to the housing requires a hermetic seal.

The seal between the diaphragm and housing in essence, should be leak-free and hence, prevent deleterious substances which may be present in the environment from attacking or otherwise interfering with the terminals and sensor components. Furthermore, the nature of the seal specifies that the transducer assembly possesses a surface which is continuous as defined by the geometrical form of the housing and must present a flat bondable surface to thus avoid any ridges or flaws which will affect the quality of the seal between the transducer and housing.

In any event, in combination with a high quality seal is the further aspect of enabling the connection of wires to terminals associated with the transducer and to make such connections simply and reliably and without interfering with the seal or the housing bonded to the diaphragm assembly. Thus, there are many patents in the prior art which attempt to solve these problems.

However, coupled with the above noted problem is the further obvious aspect of producing a device which is economical to manufacture and reliable in operation. It is furthermore desireable to provide such a device which is protected from deleterious or corrosive substances contained in the force emitting environment and which otherwise may undesirably attack or erode the transducer, diaphragm and associated sensors and terminals.

It is therefore an object of the present invention to provide an improved transducer assembly employing piezoresistive sensors secured to semiconductor diaphragms; which structures incorporate relatively flat bondable areas to enable hermetic coupling to a suitable housing, while employing protected lead and terminal configurations associated with the sensor devices associated with the transducer.

BRIEF DESCRIPTION OF PREFERRED EMBODIMENT

A semiconductor pressure transducer comprising a base member fabricated from a given conductivity semiconductor material, said base member having a top and a bottom surface with a relatively central aperture formed in said bottom surface, a plurality of contact areas diffused in said top surface of said base member with a portion of each of said contact areas extending into an area of said top surface encompassed by said central aperture, a bridge pattern of piezoresistive sensors positioned on said top surface of said base member and coupled to said contact areas, a layer of epitaxial semiconductor material secured to said top surface of said base member to form a peripheral area about said bridge pattern extending from said top surface of said base member, said layer of epitaxial material having a plurality of terminal apertures located therein, each in contact with a separate one of said contact areas in an area not encompassed by said central aperture, with the top surface of said epitaxial layer being relatively smooth, and an annular housing secured to said top surface of said epitaxial layer, said housing having an aperture realtively congruent with said aperture in said bottom surface, with the sidewall of said housing adjacent said terminal apertures in said epitaxial material.

DETAILED DESCRIPTION OF DRAWINGS

Figure 1A:
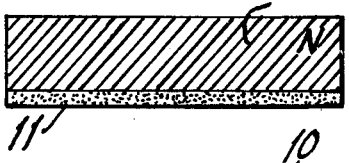
FIGS. 1A to 1F specify cross-sectional views denoting a process for fabrication of a transducer according to this invention.

Referring to FIG. 1A, there is shown a wafer 10 of n-type silicon which is to serve as a substrate in the fabrication of the transducer arrangement to be described. A layer 11 of silicon dioxide is grown on a surface of the wafer 10. The formation of a layer of silicon dioxide is well known and can be formed on wafer 10 by heating it to a temperature between 1,000° to 1,300° C. and passing oxygen over the surface. By using the layer of silicon dioxide, one can them provide a pattern mask for diffusion of the proper impurities into the wafer 10 to form contact patterns.

Figure 1B:
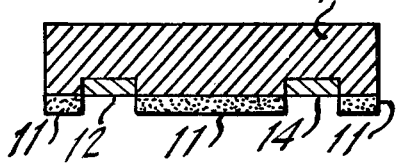

Referring to FIG. 1B, one now diffuses into wafer 10 a series of contact patterns which extend towards the periphery of the disk and emanate from the central area. The contact patterns 12 and 14 are deeply diffused which may require a double diffusion process to hence cause the contact pattern to be deeply embedded in the semiconductor wafer 10. The silicon dioxide layer 11 is then masked so that a central portion of the wafer has diffused therein, a sensor pattern 15 which in essence, is a piezoresistive pattern.

Figure 2C:
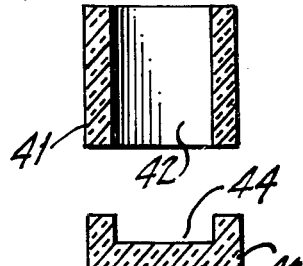
FIGS. 2C and 2F are top perspective views of the apparatus depicted in FIGS. 1C and 1F.
Figure 2C:
Figure 2C:
Figure 2C:
Figure 2C:
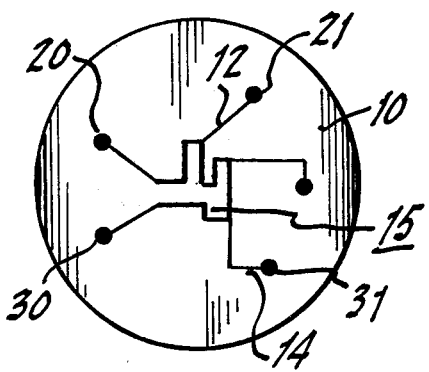

As can be seen by referring to FIG. 2C, the piezoresistive pattern 15 is centrally located on the wafer 10 to the contact patterns as 12 and 14 emanating therefrom.

It is, of course, understood that the contact pattern is implemented by deep diffusion as compared to the shallow diffusion of the sensor pattern 15.

Figure 1C:
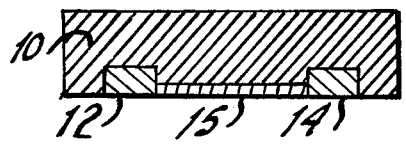

The step of diffusing the sensor pattern 15 is shown in FIG. 1C. It is well known how to accomplish the diffusion of piezoresistive elements on silicon diaphragms as well as the formation of conducting leads or contacts in conjunction with such diaphragms. An example of suitable patterns and techniques may be had by referring to U.S. Pat. No. 3,654,579 entitled ELECTROMECHANICAL TRANSDUCERS AND HOUSINGS issued on Apr. 4, 1972 to the Assignee herein.

Figure 1D:
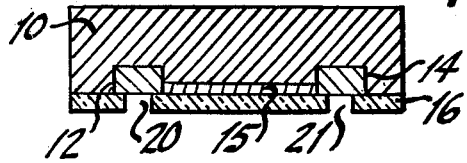

Referring to FIG. 1D, a layer of silicon dioxide or silicon nitride 16 is now formed over the entire pattern of FIG. 2C. The layer of silicon dioxide or silicon nitride is formed as indicated above, by heating the wafer and subjecting it to a suitable gas to grow the layer 16 over the entire surface of the transducer.

Holes or apertures such as 20,21 are opened in the layer of silicon dioxide or silicon nitride. The holes may be formed by a suitable chemical etching technique employing a suitable mask or pattern. Essentially, the holes thus formed are definitive of contact areas as indicated as 20 and 21 in FIG. 2C and will be those areas at which leads are attached. After the formation of the suitable apparatus as shown in FIG. 1D, a layer of epitaxial semiconductor material 25 is grown on the silicon dioxide or silicon nitride layer formed in FIG. 1D and the epitaxial material also fills the apertures 20 and 21 indicative of the terminal areas.

The layer 25 is grown, as indicated, by an epitaxial technique which is well known. In essence, the layer 25 is a silicon layer and due to the fact that it is grown on an oxide or a nitride layer as 16, the layer is polycrystalline in structure as compared to the monocrystalline wafer 10. The growth of such layers as 25 can be afforded by vapor deposition or by the hydrogen reduction of $SiCl_4$.

The film thickness or thickness of layer 25 is controlled by the reagent concentration or by the substrate temperature. There are many techniques available and known in the art for growing epitaxial layers as 25 on silicon dioxide or silicon nitride layers as 16.

Figure 1E:
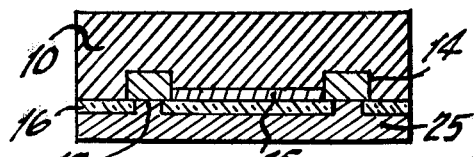
Figure 1F:
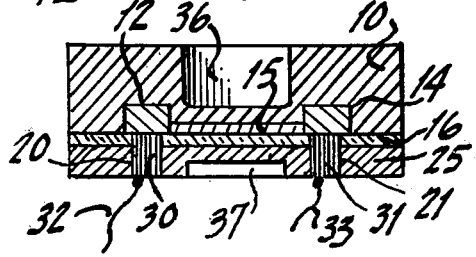

Referring to FIG. 1F, the epitaxial layer 25 is now etched in the areas 20 and 21 indicative of the contact locations. The polycrystalline is etched so that the apertures as 20 and 21 extend to the deeply diffused contact regions 12 and 14 associated with the sensor arrangement. The apertures are then filled with a metal such as 30 and 31 to form suitable contacts to which wires as 32 and 33 can be bonded to. At this point in the process, a central aperture 36 is formed in the wafer 10 and defines an active region for deflection of the diaphragm. The aperture 36 can be formed by the use of a conventional etch.

A central aperture 37 is also etched into the polycrystalline layer 25 and may be relatively congruent with aperture 36. Thus the area between apertures 36 and 37 which includes the bridge configuration 15, forms the active area or the diaphragm portion of the transducer assembly.

It is, of course, understood that aperture 36 may be etched directly unto the surface containing the bridge configuration 15.

The above described metallization process is also well known and can be accomplished by placing the processed wafer in a vacuum chamber together with a suitable source material such as aluminum. The aluminum is heated above its vaporization point by means of induction, resistance or some other form of heat. In this manner, the metal condenses on the substrate and will deposit in apertures as 30 and 31 associated with the contact areas as 20 and 21. Excess metal can then be removed by a suitable acid etching in conjunction with a photolithographic technique.

As can be seen from FIG. 1F, there is a peripheral area located between the aperture 37 and the metal contact areas 30 and 31 which comprises the layer of polycrystalline material. This area is now polished to a high surface finish. The polishing of an epitaxial layer is well known and can be accommodated by acid etching or by a conventional mechanical polishing technique.

Figure 2F:
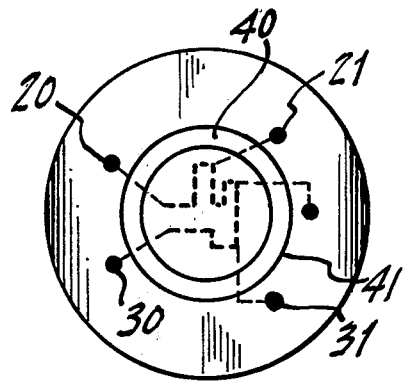

The peripheral epitaxial area 40 shown in FIG. 2F affords one a smooth mirrored finished surface. This surface then forms a flat, smooth surface to which a suitable housing can be bonded.

Referring to FIG. 1F, there is shown an annular housing 41 which has an outer dimension determined by the peripheral area 40 associated with the epitaxial layer. The housing 41 may be fabricated from glass and in essence, as indicated, is annular with a central aperture 42 relatively congruent to apertures 36 and 37. The glass housing 41 can be bonded to the epitaxial layer 25 by means of a diffusion bonding technique. Techniques for bonding silicon to glass are well known in the state of the art. The important factor here being that the annular housing can be hermetically bonded to provide a leak-free seal due to the fact that the epitaxial layer is highly polished and smooth.

Also shown located in FIG. 1F, is a U-shaped cross-sectional housing 43 which is also fabricated from glass. The member 43 is a cup-shaped member having a central depression 44 relatively congruent with apertures 36 and 37 to allow deflection of the diaphragm portion of the transducer.

Alternatively, a glass disk 45 may be directly bonded to a smooth epitaxial area 40. If a glass disk were used, the aperture 37 in the polycrystalline material would serve as a diaphragm stop to restrain the deflection of the diaphragm as a function of the depth of aperture 37. The use of silicon and glass as stop members have been described in prior patents.

Hence, the main aspect as described above is the ability to form a transducer which possesses a flat smooth surface for bonding thereto of a glass base member which as indicated, may be an annular member as 41, a cup-shaped member as 43, or a disk member as 45.

FIG. 2F is a top view of the completed structure showing the annular housing 41 bonded to the configuration. The resultant transducer as shown in FIG. 1F has the sensor configuration 15 protected on one side by the material of the n-type wafer 10 and at the other side by a thin layer of silicon dioxide together with a portion, if necessary, of the expitaxial layer 25. Similarly, the contacts as 12 and 14 are also located adjacent the sensor arrangement and are protected by the n-type wafer 10 and surrounded by the silicon dioxide and epitaxial layers.

It is noted that the above described techniques are extremely suitable for diaphragms which are relatively thick and are used to monitor large pressures as applied thereto.

As above indicated, the glass housing is fabricated from a suitable glass which has a matching thermalcoefficient with the silicon. The glass housing is joined to the smooth surface of layer 25 as indicated, by a diffusion bond which can be implemented by maintaining a pressure between the transducer assembly and the glass base member prior to bonding. During the application of pressure to the composite structure in an elevated temperature environment, an electric potential is applied between the parts to cause a molecular bond to be formed by the transporting of molecules between the glass and the polycrystalline semiconductor member 25. The bond thus formed between the smooth semiconductor surface and the peripheral edge of the glass base member is extremely strong and uniform, thus providing a hermetic seal about the active portion of the transducer arrangement.

As shown in FIG. 2F, the contact areas as 20 and 21 are located on the non-active portion of the transducer and hence, do not affect the frequency of operation, nor serve to unduly load or affect diaphragm operation. The semiconductor bridge configuration 15, and the contact areas 12 are not exposed to the outside environment due to the fact that they are buried within the transducer structure as described above.

The housing 41 may be of any length required due to a particular application and may be directly inserted in a force transmitting environment whereby any deleterious substances contained in that environment will not affect the sensor or contact material.

Figure 3A:
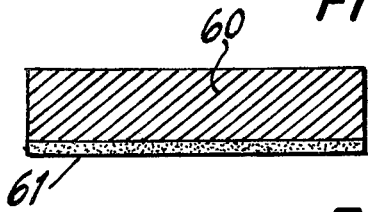
FIGS. 3A to 3E are cross-sectional views necessary to depict the fabrication of an alternate embodiment of a transducer.

Referring to FIG. 3A, there is shown an alternate way of forming a composite transducer posessing the above described qualities of providing a flat, smooth, bondable surface with buried contacts and sensor configurations.

A wafer 60 comprises n-type single crystal silicon. A layer of silicon dioxide 61 is then grown on a surface of wafer 60.

Figure 3B:
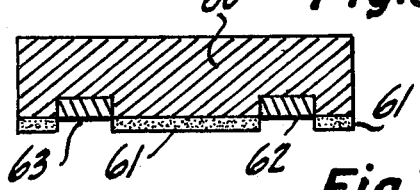
Figure 4B:
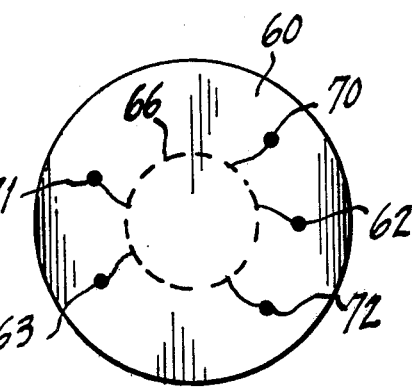
FIGS. 4B and 4E are top views depicting the nature of the structure shown in FIGS. 3B and 3E.

Referring to FIG. 3B, the layer 61 is then treated by means of a suitable mask and etchants to form a contact pattern. The contact pattern 62 and 63 is diffused into the n-type wafer 60 and comprises a plurality of terminal paths which extend into the predetermined active area 66 of the transducer. A top view of the contact patterns is shown in FIG. 4B. Thus, as indicated in FIG. 3B, the contact patterns are diffused into wafer 60.

The next step is to completely remove the layer of silicon dioxide 61 so one has the wafer 60 with the contact patterns as 62 and 63 diffused therein. It is, of course, noted that alternate contact paths as shown in FIG. 4B as 70,71 and 72 are likewise diffused simultaneously with 62 and 63.

Figure 3C:
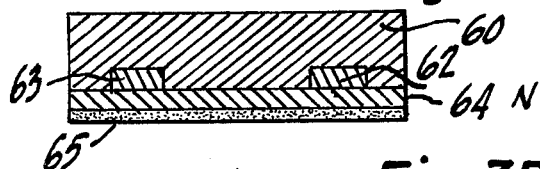

The next step in the procedure is depicted in FIG. 3C. The layer of silicon dioxide 61 is removed and a layer 64 of n-type silicon is epitaxially grown on wafer 60 to completely cover the surface of the wafer and the contact patterns 62 and 63. It is noted that the layer 64 is an epitaxial layer, but is a single crystal layer, since it is not grown on silicon dioxide or nitride but is grown directly upon the n-type wafer 60.

The layer 64 may be a desired thickness which may be between 0.05 to 2.0 mils, depending upon the desired diaphragm thickness.

Thus, it is understood that layer 64 is single crystal epitaxial as compared to layer 25 of FIG. 1E, which is polycrystal epitaxial.

Figure 3D:
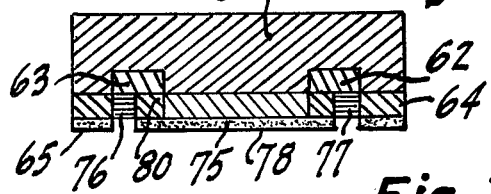

Referring to FIG. 3D, the layer 64 may then have grown thereon, a layer of silicon dioxide 65. By the use of photolithographic masks, the layer 65 is used to diffuse into layer 64, a sensor pattern or piezoresistive bridge pattern 75 in contact with the already diffused contact patterns 62 and 63.

Also shown in FIG. 3D is the formation of apertures 76 and 77 which contact the contact areas 62 and 63. The processes indicated in FIG. 3D may be implemented by a two-step diffusion process to assure proper formation of the sensor pattern 75 and the contact areas 76 and 77 associated with the contact patterns 62 and 63. The apertures 76 and 77 may be metallized as above indicated so that leads can be joined to the metallized areas 76 and 77.

It is again seen that the contact areas 62 and 63 are buried within the diaphragm and the bridge configuration 75 is protected on both sides respectively by the wafer material 60 and a layer of silicon dioxide 78 which is formed during the diffusion of the sensor pattern 75.

Figure 3E:
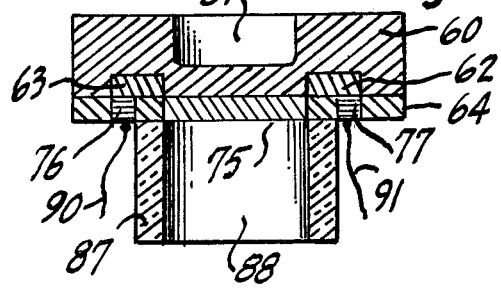
Figure 4E:
Figure 4E:
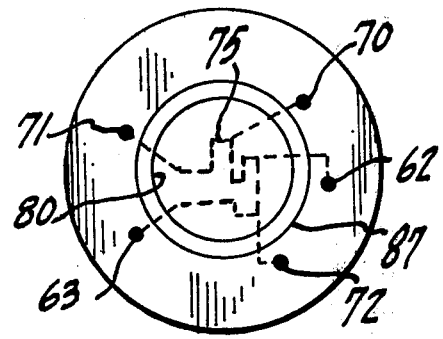

It is, of course, clear that the peripheral area 80 is formed about the active area 66 of the diaphragm. This area 80 is again between the sensor pattern 75 and the contact terminal areas 76 and 77. An aperture 81 is then etched on the top surface of wafer 60 to define the active area 66 of the diaphragm. The peripheral area 80 is then polished to a flat uniform surface and a glass housing 87 is bonded thereto. The housing 87 as above indicated, may be an annular ring with a central aperture 88 relatively congruent with the active area 66 or a cross-sectional "U" shaped cup member as 89. Thus, a suitable housing 87 can be hermetically bonded to the area 80 as described above in connection with FIG. 1F. Leads as 90 and 91 are coupled to terminal areas 76 and 77 to complete the transducer as shown in FIG. 3E as indicated in the top view of FIG. 4E. The contact areas as 76 and 77 and associated leads 90 and 91 are outside the active area as described in conjunction with FIGS. 1A to 1F.

It is noted that in both described methods and structures, the use of an epitaxial layer enables close control of the thickness of the transducer assembly due to the vapor deposition techniques associated with epitaxial growth. The use of the epitaxial layer allows one to etch suitable apertures in the material to contact the "buried" diffused contact areas such as 12 and 14 of FIG. 1 and 62 and 63 of FIG. 3. The epitaxial layer permits one to provide a smooth, complemental surface for bonding to a glass housing, by employing a suitable etch or polishing technique to enable an intimate coupling by means of the above described diffusion bond. This, as indicated, enables one to imlement a leak-proof hermetic seal while the contacts and sensor configurations associated with the final transducer are protected, with the leads further located outside the active diaphragm region.

In regard to the above description, it is also clear that in the fabrication of the device shown in FIG. 3, one could etch a depression in the active region of the epitaxial layer 64 before diffusing the sensor configuration therein. The depression would be a shallow depression and serving as a stop as described in conjunction with the stop 37 of FIG. 1F.

It is also noted that the lead apertures such as 76 and 77 of FIG. 3D and 20 and 21 of FIG. 1F do not have to be completely filled with metal. In this manner, one may partly fill the apertures with metal and use flip chip bonding techniques to enable the final transducer to be employed on a flip chip assembly.

We claim:
1. A semiconductor pressure transducer, comprising:
   (a) a semiconductor base member having a central depression on a bottom surface, said depression defining an active region which deflects upon application of a force to said member, (b) at least one contact area diffused into a top surface of said base member and directed from said active region towards the periphery of said base member, (c) a piezoresistive sensor located on said top surface of said base member and in contact with said contact area within said active region, (d) an epitaxial semiconductor layer located on and extending from said top surface of said base member and surrounding said active region, said layer having at least one terminal aperture on a surface thereof in communication with said contact area closest to said periphery of said base member, and (e) an annular housing, said housing having sidewalls of a predetermined thickness with the inner periphery of said sidewalls forming a central aperture relatively congruent to said central depression, said housing coupled to said epitaxial layer with the inner periphery of said sidewalls surrounding said central depression and with the outer periphery of said sidewalls adjacent said terminal aperture in said epitaxial layer to therefore completely mechanically isolate said terminal aperture from said active region by said thickness of said sidewalls.

2. The transducer according to claim 1 wherein said piezoresistive sensor is diffused into said top surface of said base member.

3. The transducer according to claim 1 wherein said piezoresistive sensor is diffused into said epitaxial layer.

4. The transducer according to claim 1 wherein said aperture in said epitaxial layer is deposited with metal in contact with said contact area and lead means coupled to said metal.

5. The transducer according to claim 1 wherein said epitaxial layer includes a central aperture relatively congruent to said active region.

6. The transducer according to claim 1 wherein said housing is fabricated from glass and bonded to said epitaxial layer by means of a diffusion bond.

7. The transducer according to claim 1 further including an oxide layer deposited on said top surface of said base member.

8. A semiconductor pressure transducer, comprising:

(a) a base member fabricated from a given conductivity semiconductor material, said base member having a top and a bottom surface with a relatively central aperture formed in said bottom surface, (b) a plurality of contact areas diffused in said top surface of said base member with a portion of each of said contact areas extending into an area of said top surface encompassed by said central aperture, (c) a bridge pattern of piezoresistive sensors positioned on said top surface of said base member and coupled to said contact areas, (d) a layer of epitaxial semiconductor material secured to said top surface of said base member to form a peripheral area about said bridge pattern extending from said top surface of said base member, said layer of epitaxial material having a plurality of terminal apertures located therein, each in contact with a separate one of said contact areas in an area not encompassed by said central aperture, with the top surface of said epitaxial layer being relatively smooth, (e) an annular housing secured to said top surface of said epitaxial layer, said housing having an aperture relatively congruent with said aperture in said bottom surface, with the sidewall of said housing adjacent said terminal apertures in said epitaxial material.

9. A semiconductor pressure transducer according to claim 8 wherein said base member is fabricated from n-type silicon.

10. A semiconductor member according to claim 8 wherein said contact areas are p-type diffusion.

11. A semiconductor pressure transducer according to claim 8 wherein said layer of epitaxial semiconductor material is between 0.05 to 2.0 mils.

12. The semiconductor pressure transducer according to claim 8 further including metal deposited in each of said terminal apertures associated with said layer of epitaxial material and lead means coupled to said metal to provide a plurality of leads emanating from said transducer.

13. The semiconductor pressure transducer according to claim 8 wherein said annular housing is fabricated from glass and is bonded to said top surface of said epitaxial layer by means of a diffusion bond.

* * * * *